United States Patent [19]

Moore

[11] Patent Number: 4,921,564
[45] Date of Patent: May 1, 1990

[54] METHOD AND APPARATUS FOR REMOVING CIRCUIT CHIPS FROM WAFER HANDLING TAPE

[75] Inventor: Arthur H. Moore, Fillmore, Calif.

[73] Assignee: Semiconductor Equipment Corp., Moorpark, Calif.

[21] Appl. No.: 197,306

[22] Filed: May 23, 1988

[51] Int. Cl.$^5$ .............................................. B32B 31/18
[52] U.S. Cl. ................................... 156/344; 156/584; 269/21
[58] Field of Search ........................ 156/344, 584, 247; 269/21

[56] References Cited

U.S. PATENT DOCUMENTS

| | | | |
|---|---|---|---|
| 3,747,282 | 7/1973 | Katzke | 269/21 X |
| 3,752,717 | 8/1973 | White | 156/155 X |
| 3,809,050 | 5/1974 | Chough et al. | 269/21 X |
| 3,970,494 | 7/1976 | Pritchard | 156/344 X |
| 4,104,099 | 8/1978 | Scherrer | 156/247 X |
| 4,433,835 | 2/1984 | Wheeler | 269/21 X |
| 4,472,218 | 9/1984 | Avedissian et al. | 156/584 X |
| 4,664,739 | 5/1987 | Aurichio | 156/344 |
| 4,667,944 | 5/1987 | Althouse | 269/21 |
| 4,711,014 | 12/1987 | Althouse | 156/344 X |
| 4,778,326 | 10/1988 | Althouse et al. | 269/21 X |

FOREIGN PATENT DOCUMENTS 2151414  4/1973  Fed. Rep. of Germany ...... 156/344

*Primary Examiner*—Robert A. Dawson
*Attorney, Agent, or Firm*—Kenneth E. Darnell

[57] ABSTRACT

A method and apparatus for applying vacuum forces to at least portions of the underside of wafer handling tape to facilitate removal of sawn or scribed circuit chips from the tape, the invention includes heating of the tape/chip to further reduce adhesion of the chip to the tape. The invention reduces handling damage to circuit chips conventionally caused by manual techniques used to remove chips from handling tape and allows chip removal without the use of a conventional die ejector. Apparatus according to the invention includes a vacuum plate grooved to provide a pattern of pins having planar mounting surfaces on which the handling tape is carried, vacuum applied through the plate causing portions of the tape to pull into the grooves adjacent the pins to reduce the area of contact between the underside of the chips and the surface of the tape on which the chips are adhered. Heating of the tape and chips while under vacuum facilitates chip removal from the tape.

16 Claims, 3 Drawing Sheets

METHOD AND APPARATUS FOR REMOVING CIRCUIT CHIPS FROM WAFER HANDLING TAPE

BACKGROUND OF THE INVENTION

1. Field of the Invention

The invention relates generally to chip or die handling during fabrication of microelectronic circuit chips and specifically to a method and apparatus for facilitating the removal of circuit chips from wafer handling tape after separation operations such as sawing or scribing.

2. Description of the Prior Art

Current conventional practice in the manufacture of circuit chips most commonly involves the fabrication of semiconductor wafers which are usually 2 to 6 inches in diameter and approximately 0.010 inch to 0.020 inch thick. Formed on one surface of the wafer is a grid of semiconductor devices comprising individual circuit elements which are to be separated into discrete circuit chips or dies. These individual circuit elements typically vary in size from 0.010" to 0.50" square. Such circuit chips vary tremendously in circuitry and function but are generally processed similarly once formed on a wafer. In particular, the circuit chips are separated with a diamond saw or diamond scriber after the wafer has been mounted to a piece of wafer handling tape such that the wafer is fixed during the sawing operation and the chips thus separated from each other are held in place after completion of the sawing operation. The tape bearing the wafer can be affixed to a film frame either by hand or with a wafer film frame mounting device as is conventional in the art. After separation of the circuit chips from each other, the individual chips must be removed from the tape without damage to the chips. Conventional practice has included the use of a wafer expanding device which facilitates the separation of the circuit chips from each other. The circuit chips are then manually removed from the tape after expanding through the use of tweezers, vacuum pencils, etc. or through the use of devices such as die ejector systems. The manual techniques including the use of tweezers suffer from the disadvantages that damage often occurs to the circuit chips simply through mechanical contact between the tweezers and the circuit chips. The use of die ejector systems also has disadvantages including the transfer of small spots of tape onto the back of the circuit chips once the ejector needle of the ejector system becomes dull through use. Many ejector systems impact the back of the circuit chip with such force that discontinuities can be formed in the back surface of the chip.

Prior attempts to address the problems noted above include those methods and apparatus described in U.S. Pat. Nos. 4,667,944 and 4,711,014 to Althouse. As described in these patents, Althouse provides a fabric having spaced fiber cross overs used in association with a chip-bearing tape with vacuum forces being used to facilitate removal of chips from the tape. Chough et al., in U.S. Pat. No. 3,809,050, mounts a wafer for dicing with a vacuum plate having individual apertures which apparently align with each chip after dicing. Chough et al. do not provide the ability to pull portions of the tape contacting each chip away from the chip for facilitating release of the chip from the tape. Wheeler, in U.S. Pat. No. 4,433,835, and Avedissien et al., in U.S. Pat. No. 4,472,218, teach the use of vacuum to hold either undiced or diced wafers in place for processing operations. Avedissien et al. remove chips from a tape through the use of a punch-like needle which comes up from beneath the tape and contacts the chip to separate the chip from the tape. As such, Avedissien et al. describe the use of die ejector systems having problems as are noted above. In U.S. Pat. No. 4,664,739, Aurichio describes heating of a wafer/adhesive film assembly prior to dicing. However, Aurichio does not utilize his heating step in a manner which would facilitate removal of circuit chips from handling tape. In U.S. Pat. Nos. 3,851,758 and 3,915,784, Makhijani et al. utilize a bond releasing fluid for removing chips from a tape. Beltz et al, in U.S. Pat. No. 4,466,852, also utilize a fluid for dislodging chips from a tape. Prior art similar to that noted above can also be found in U.S. Pat. Nos. 3,681,139 to Jannett et al. and 4,395,451 to Althouse. While the methodology and apparatus described in the aforesaid patents are directed in certain respects to the problems addressed by the present method and apparatus, the prior art including the art represented by the aforesaid patents does not fully address the problems noted above relative to the removal of circuit chips directly from wafer handling tape or other handling tape without damage to the circuit chips. The present method and apparatus greatly facilitates removal of circuit chips from such tape both rapidly and without damage to the circuit chips. Further, practice of the present invention allows elimination of certain steps conventionally employed in the removal of chips from tape and also eliminates the need for apparatus utilized in the practice of these steps. Accordingly, the invention provides method and apparatus which facilitates rapid removal of circuit chips from wafer handling tape and similar tapes with reduced damage to the circuit chips and at lower cost due to the elimination of certain presently conventional processing steps and the apparatus necessary for practice of these processing steps.

SUMMARY OF THE INVENTION

The invention provides a method practicable as both a new step in an otherwise conventional wafer handling process which is part of semiconductor chip fabrication and as methodology for removal of dies or chips from tape in any process involving the use of tape to temporarily mount a chip. In such processing, a circuit chip must be removed from the tape without damage to the chip and without leaving material from the tape on any portion of the chip. In a general embodiment, the method involves application of a vacuum to at least portions of the underside of a tape, such as wafer handling tape, one or more chips which are to be removed from the tape being adhered to the tape on an upper surface of the tape. The portion of the tape exposed to the vacuum is pulled away from the chip, thereby reducing the area of contact between the tape and the chip with a resulting reduction in the adherent forces causing the chip to remain mounted on the tape. Heating of the tape further reduces the adherent forces exerted by the tape and therefore facilitates further the removal of the chip from the tape by means of a vacuum pencil, vacuum collet or the like. During the heating step according to the invention, the chip itself may be heated to at least some degree. Of importance to an understanding of the advantages accruing from the practice of the present method is the fact that a chip can be more easily removed from the tape both immediately after heating and for any period of time after completion of the heating step. In other words, the chip can be easily removed from the tape even after complete cooling of the tape/chip on discontinuation of heat application.

The invention further provides apparatus capable of performing the method of the invention, the apparatus including a vacuum plate having a pattern of grooves formed therein which results in the formation of a multiplicity of vertically disposed pins. Each of the pins has a flat uppermost surface which lies in a plane common to the remaining pins in a preferred embodiment. Vacuum conditions created within grooves adjacent to the pins cause at least portions of tape mounted by the pins to pull into the grooves and thus reduce the contact area between the chip and the tape. The removal process is facilitated by the application of heat to at least the tape and typically to the tape and chip assembly such that the adherent forces between the chip and tape are further reduced. Heating can be accomplished by electrical resistance heater elements located within the vacuum plate, by heat applied externally of the vacuum plate to the chip/tape assembly or through the vacuum plate by external heating elements. As will be apparent to those skilled in the art, heat can also be applied through the vacuum plate by means of heated fluid passing in heat exchange relation with the vacuum plate through passages formed in said plate.

The methodology and apparatus provided by the invention provides a significant advance in the art of semiconductor circuit manufacture by facilitating the rapid handling of diced wafers while minimizing damage to individual circuit chips during removal from wafer handling tape or similar tape. Practice of the invention has the further advantage of eliminating the transfer of material from the tape to a chip, a common problem inherent in many prior art processing techniques. Further, the present invention eliminates damage to undersurfaces of circuit chips which often results from inordinately forceful impact between the poker pin of a die ejector system and the chip undersurface. The circuit chips thus removed from a wafer handling tape or similar tape according to the invention are relatively damage free and uncontaminated by extraneous materials and are ready for subsequent use.

It is therefore an object of the present invention to provide method and apparatus for removing circuit chips from a wafer handling tape or similar tape on which the chips have been held for processing operations involved in the fabrication of semiconductor devices.

It is another object of the invention to provide a method and apparatus wherein vacuum forces can be applied to at least portions of the underside of wafer handling tape or similar tape to facilitate removal of circuit chips from the tape, the invention including heating of at least the tape to further reduce adhesion between the chip and the tape.

It is yet another object of the invention to provide a method and apparatus useful in the removal of circuit chips from wafer handling tape or similar tape whereby the chips can be removed by manual techniques without the use of a conventional die ejector and with at least a reduction in damage usually caused by the removal of circuit chips from tape when manual techniques are utilized.

It is a further object of the invention to provide method and apparatus wherein the degree of adhesion is reduced between a circuit chip and tape to which the chip is mounted so that the chip can be readily and rapidly removed from the tape without damage to the chip and without leaving material from the tape adhered to the chip, thereby facilitating further processing of the circuit chip in the manufacture of semiconductor devices.

Further objects and advantages of the invention will become more readily apparent in light of the following description of the preferred embodiments.

DESCRIPTION OF THE PREFERRED EMBODIMENTS

Figure 1:
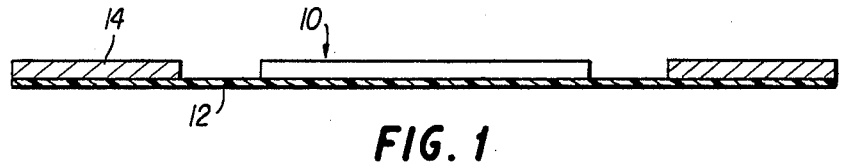
FIG. 1 is an idealized view in partial section of a semiconductor wafer mounted to a wafer handling tape or film, the film being carried by a film frame according to standard processing techniques.

Referring now to the drawings and particularly to FIG. 1, a semiconductor wafer is seen at 10 to be mounted to wafer handling tape 12 attached to film frame 14 in a conventional manner. The tape 12 is also referred to in the art as "film" and is conventionally mounted to the film frame 14 such as by means of a wafer film frame tape applicator (not shown). An example of such an applicator is the Model 3100 wafer film frame tape applicator available from Semiconductor Equipment Corp. of Moorpark, California. Prior to mounting of the wafer 10 as shown in FIG. 1, the wafer 10 is processed to form a grid of semiconductor circuits on the upper face of the wafer 10. Typically, the wafer 10 is approximately 2" to 6" in diameter and approximately 0.01" to 0.02" thick. The individual circuits or chips which are to be formed from the wafer 10 can vary in size and are typically from 0.01" to 0.5" square.

The wafer 10 shown mounted in FIG. 1 is subjected to a sawing or scribing operation as is conventional in the art. A representative dicing saw apparatus capable of such a sawing function is the Tempress Model 604 available from Micro Automation, a unit of General Signal, Fremont, Calif. An example of apparatus capable of performing a scribing operation for separation of the circuits on the upper surface of the wafer 10 is the Model 2800 automatic scriber available from Semiconductor Equipment Corp., Moorpark, Calif. After the conventional sawing or scribing operation, the film frame 14 is seen to mount the tape 12 with the wafer 10 being diced into a multiplicity of circuit chips 11, the chips 11 being adhered to the tape 12. The circuit chips 11 are also referred to as dies or by other designations such as microelectronic chips, etc. The nature of the circuitry formed on the chips 11 or the nature of the material forming at least interior portions of the chips 11 is essentially immaterial to the invention and can take any variety of forms, the invention being capable of use with a variety of chip sizes, chip shapes, etc.

Figure 2:
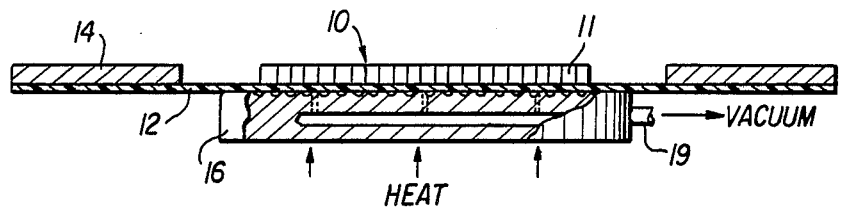
FIG. 2 is an elevational view of an idealized assembly of a wafer, tape and film frame after sawing or scribing of the wafer with the assembly being contacted with a vacuum plate according to the invention such that vacuum and heat are applied to the tape to facilitate release of individual circuit chips from the tape.

In a conventional die handling system, a Die Matrix Expander such as the Model 2600 available from Semiconductor Equipment Corp., Moorpark, Calif., can be utilized after the sawing or scribing operation. The process herein provided allows removal of the dies or chips 11 from the tape 12 after sawing or scribing without the need for expanding the chip/tape assembly. However, the present method can include an expanding step if desired although such a step is not typically necessary when practicing the method of the present invention. The method of the present invention is preferably utilized after the sawing or scribing step described above. As seen in FIG. 2, the film frame 14 bearing the tape 12 to which the sawn or scribed chips 11 are attached is placed as an assembly over vacuum plate 16. The vacuum plate 16 will be described in detail hereinafter. At present, it is only necessary to note that a vacuum is pulled at the upper surface of the plate 16 through vacuum line 19 communicating with channels interiorly of the plate 16. The upper surface of the vacuum plate 16 is preferably formed by the cutting of a grid (shown as 36 in FIGS. 7 and 8) of intersecting grooves 20, the grooves 20 preferably being cut with a ball end mill such that projecting pins 18 have base portions at anterior ends thereof which are more wide than the distal ends of the pins 18. By so forming the grooves 20, the pins 18 have greater structural integrity and are substantially less prone to break. It should be realized that the grooves 20 can be otherwise formed, such as with an end mill. In such a manufacturing operation, the grooves would not be arcuate at lower portions thereof but would be substantially squared off. Such formation of the grooves 20 and the resulting pins 18 would be adequate as long as the pins 18 retain structural integrity and do not readily break off.

As is noted in FIG. 3, imposition of a vacuum within the grooves 20 disposed below the tape 12 results in those portions of the tape 12 surmounting the grooves 20 to be pulled downwardly into the grooves 20 and thus to release from those portions of the chips 11 to which the tape had previously adhered. The reduction in adhesion between the chips 11 and the tape 12 facilitates removal of the chips 11 from the tape 12 through use of a vacuum collet, vacuum pencil, etc. As particularly seen in FIG. 2, however, release of the chips 11 from the tape 12 is further facilitated by the application of heat to the tape 12 and at least partially to the chips 11. Heat is preferably supplied through the vacuum plate 16 such as by placement of the vacuum plate 16 on a hot plate 24 mounted on base 26. As is seen in FIG. 5, a vacuum pencil 28 is disposed in a position such that the chips 11 can be removed from the tape 12 after the heating step is accomplished.

In a typical processing situation, the tape 12 is heated to a temperature of between 50° C. to 65° C. The temperature to which the tape 12 is raised can be other than that expressly noted above. When the plate 16 is not preheated, some period of time, such as 15 minutes, is necessary to raise the plate 16 to the appropriate temperature. It should be noted that the circuit chips 11 become more easily removed from the tape 12 not only during heating and immediately after the heating step, but also after the heating step is completed and the assembly allowed to completely cool. In other words, the circuit chips 11 can be readily removed from the tape 12 after any period of time on cooling of the tape. The adhesion between the chips 11 and the tape 12, once reduced according to the invention, does not regenerate even after hours or even days once heating has been discontinued.

Figure 6:
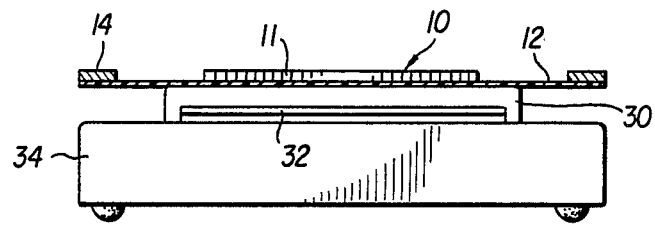
FIG. 6 is an elevational view in partial section of the diced wafer, tape and film frame mounted to an embodiment of the present apparatus wherein heating elements are formed within a vacuum plate according to the invention.
Figure 4:
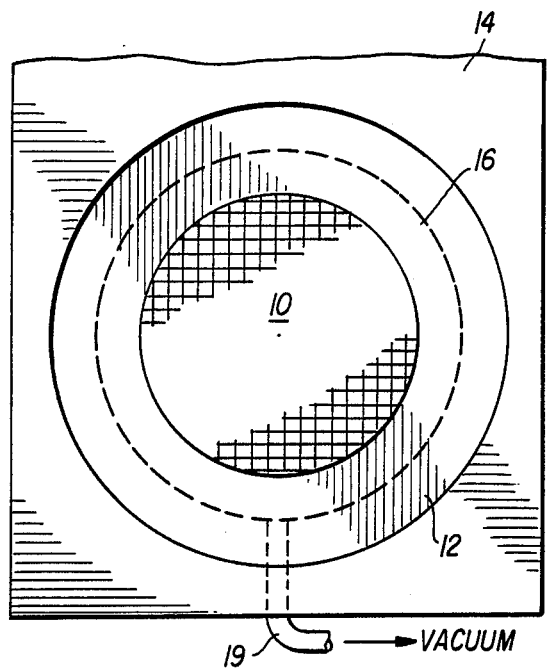
FIG. 4 is a plan view of the diced wafer, tape and film holder mounted to the apparatus of the invention.
Figure 5:
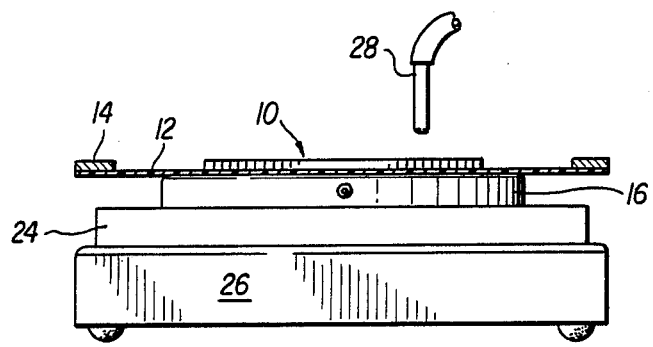
FIG. 5 is an elevational view in partial section of the diced wafer, tape and film holder mounted to the apparatus of the invention.

Referring now to FIG. 6, a vacuum plate 30 configured according to the invention is seen to have heating element 32 mounted therein such that heat can be supplied from internally of the vacuum plate 30 to heat the tape 12 and the chips 11 without the requirement for the hot plate 24 as noted in FIG. 5. The vacuum plate 30 can be permanently mounted to a base 34 as desired. The method in a preferred form generally involves the heating of the tape 12 with at least some heating of the circuit chips 11, especially at the interface of the chips 11 and the tape 12. Such heating could occur other than as shown and described hereinabove. For example, heating could occur by the disposition in a heated oven or the like of the vacuum plate 16 and the film frame 14 carrying the tape 12 and the circuit chips 11 adhering thereto. Further, hot air could be directed onto the tape 12 and the circuit chips 11. In one form, the invention can be practiced with simultaneous heating and pulling of the vacuum. In a second form, vacuum can be applied to a degree sufficient to cause the tape 12 to pull away from surfaces of the circuit chips 11 to form spaces 22 as seen in FIG. 3 and then heat can be applied after discontinuation of vacuum. Even after discontinuation of the vacuum, the spaces 22 effectively remain and heat can then be applied. While the method of the invention can also be practiced through the use of vacuum only, the present method is preferably practiced by concurrent application of vacuum and heat.

Figure 3:
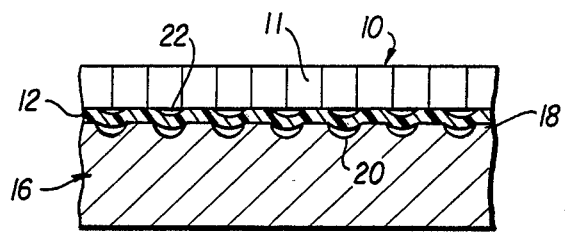
FIG. 3 is an idealized detailed view in partial section of the diced wafer and tape mounted to the vacuum plate of the invention.
Figure 7:
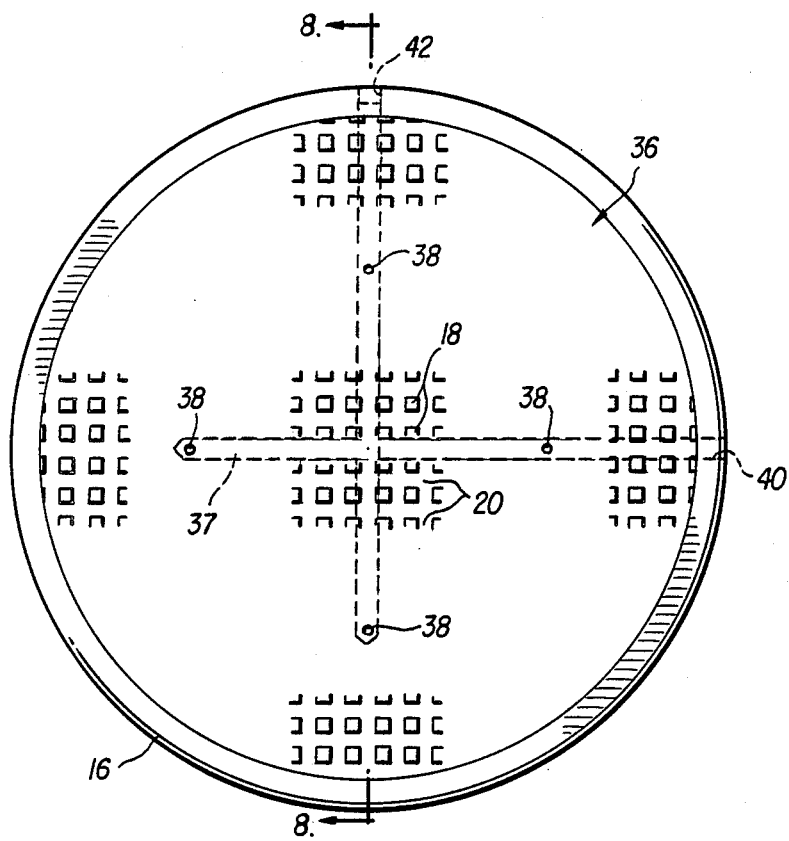
FIG. 7 is a plan view of a vacuum plate configured according to the invention; and, FIG. 8 is a sectional view of the vacuum plate of FIG. 7.
Figure 8:
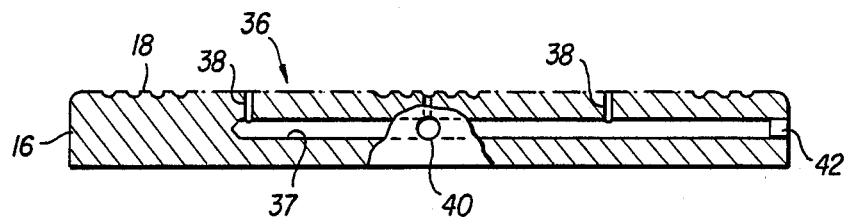

Referring now to FIGS. 7 and 8, a vacuum plate is shown to be configured in the manner of the vacuum plate 16 referred to relative to FIGS. 2 and 3. It is to be understood that the vacuum plate 16 can be formed with integral heating elements although, for the sake of simplicity, the vacuum plate 16 of FIGS. 7 and 8 is not shown with heating elements in order that the vacuum-producing portions of the plate 16 can be more easily shown. The vacuum plate 16 is preferably formed as a circular block of aluminum or similar metal. The material from which the plate 16 is formed is chosen for machining ease as well as for heat conductive properties. The pins 18 are seen to form a grid 36, the pins being effectively defined by the grooves 20 which are cut into the outer face of the plate 16. For reasons described above, the grooves 20 are circular at lower portions thereof in order to provide a wider base for each of the pins 18. The portions of the pins 18 near distal ends thereof can be straight-sided or can be arcuately contoured with the lowermost portions of the structure defining the grooves 20. While the pins 18 can vary widely in size and pattern, a typical dimension of the upper planar surfaces of each pin 18 is approximately 0.011" square with the grooves 20 being approximately 0.046" in width. When the pins 18 are formed with straight-sided walls near the distal ends thereof, the height of the straight-walled portion is typically taken to be approximately 0.010" surmounting an arcuate base portion having similar dimension. The plate 16 is preferably formed of a rigid material having good heat conductivity characteristics, aluminum or similar metal being preferred.

Vacuum channels 37 are cut in the interior of the plate 16, one of the channels 37 terminating in a plug opening 40 while the other vacuum channel 37 terminates in tap opening 42. Such openings are conventional in the art when used with vacuum chucks or vacuum holders such as are employed in microelectronics fabrication to hold wafer-bearing film frames for scribing or sawing. In a manner similar to such prior art structures, the vacuum channels 37 have vacuum holes 38 extending upwardly through the plate 16 as is seen in FIG. 8 to communicate with the network of grooves 20. Accordingly, placement of a film or tape such as the tape 12 over the grid 36 results in the tape being held on the vacuum plate 16 by the vacuum forces thus produced. Patterns other than the four-hole pattern formed by the vacuum holes 38 in FIG. 7 can be utilized without departing from the scope and intent of the invention.

As has been described above, those portions of the tape 12 disposed above the grooves 20 are pulled down into the grooves to provide at least a partial release of the tape 12 from the under side of the circuit chips 11. The circuit chips 11 are then readily removable from the tape 12 for further processing such as processing with a die bonder such as the Model 4000 Eutectic Die Bonder available from Semiconductor Equipment Corp., Moorpark, Calif. Use of the present method and apparatus allows elimination of prior separation steps including die expansion as is desired and die ejection such as through a poker plate system.

As has been alluded to above, the present method and apparatus can be used in a wafer handling system which is conventional other than in regard to the method step or steps provided by the invention. It is also possible to use the present method and apparatus in other than the particular wafer handling process referred to above since the invention can be utilized in any situation wherein one or more dies are mounted to tape or similar handling film and is to be removed from such tape or film. Tape or film such as is commonly used in wafer handling processing is ordinarily referred to as "blue" or "clear" tape and is available in a variety of sizes and shapes from Semiconductor Equipment Corp., Moorpark, California. Wafer handling tape is typically formed of a flexible polyvinylchloride film with an adhesive such as an acrylic adhesive bonded to one side of the film. A wafer is attached to the side of the film having adhesive formed thereon. The thickness of such film is typically in the range of 0.003 to 0.004" but can be of any suitable thickness as is required according to a particular application. The thickness of such tapes is typically given as between 3 and 5 mils.

Considering now particular conditions of the several embodiments of the present process, it is to be noted that the heating times of approximately 15 minutes noted above relates to a start-up situation wherein the vacuum plate 16 is unheated at the beginning of the operation. The vacuum plate 16 can be and preferably is preheated to a temperature of between 50° C. and 65° C. prior to placement of the sawn wafer/tape assembly thereon. When the vacuum plate 16 is preheated in this manner and vacuum is being applied or has already been applied as aforesaid, the tape 12 and the adhesive interface between the tape 12 and the chips 11 will quickly heat to a temperature sufficient to facilitate release and removal of the chips 11 from the tape 12. In practice, only a matter of three to five seconds is required, the release being almost immediate.

The temperature to which the tape 12 and the adhesive interface should be heated varies with the nature of the tape (and adhesive material on the tape) and the nature of the surface of the chips 11 adhering to the tape 12. When the surface of the chips 11 adhered to the tape 12 is "shiny", that is, is plated with a metal such as gold or the like, the adhesion between the tape 12 and the chips 11 is greater and a higher temperature is required. Accordingly, the necessary temperature to which the tape 12 and adhesive interface is to be heated can readily be determined and can vary outside of the usually preferred range of 50° C. to 65° C. The invention includes within its scope a heating as aforesaid to any temperature necessary to accomplish sufficient release of the chips 11 from the tape 12 to allow removal as aforesaid.

Practice of the invention in the embodiments contemplated by the invention typically results in at least some heating of the chips 11. When heat is directed upwardly through the tape 12 as seen in the drawing, it is apparent that those portions of the chips 11 nearmost the tape 12 will be heated to a higher temperature than will outermost portions of the chips 11. The degree of heating of the several portions of the chips 11 is less important than the heating of the adhesive interface between the chips 11 and the tape 12. The tape 12 is typically heated to the same degree as is the adhesive interface. When heating is accomplished by placement of the chips/tape in an oven or by the direction of hot air onto the chips/tape assembly, then the chips 11 can be heated to a degree at least equal to or greater than heating of the tape 12. It will be apparent to one of ordinary skill in the art given the teachings of the invention that such parameters can vary without departing from the scope and intent of the invention.

The vacuum applied through the vacuum plate 16 can also vary as will be apparent to one of ordinary skill in the art. A reading of 25 inches on a typical vacuum pump (not shown) is typical to produce an adequate "pull down" of the tape 12. The vacuum levels within the grooves 20 can be chosen to produce the results described herein.

Figure 9:
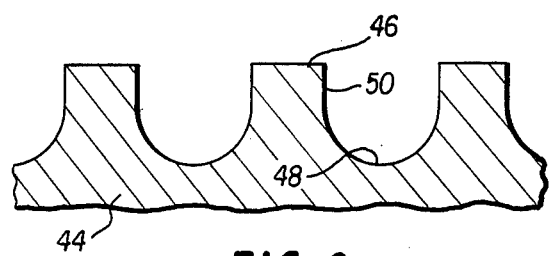

Referring now to FIG. 9, an alternative configuration of the grid 36 of the plate 16 can be seen in vacuum plate 44 which differs from the vacuum plate 16 of FIGS. 7 and 8 by the provision of straight-sided wall portions 50 surmounting arcuate grooves 48. The grooves 48 essentially correspond to the grooves 20 referred to above. However, the grooves 48 of FIG. 9 continue upwardly along the wall portions 50 of pins 46. The straight-sided wall portions 50 facilitate the pulling down of the tape 12 by virtue of less material mass of the pins 46 in the spaces where portions of the tape 12 are pulled down.

Although the invention has been described above in relation to particular embodiments thereof, it is to be understood that the invention can be practiced in forms other than explicitly described without departing from the scope and intent of the invention.

What is claimed is:

1. In a method for handling a semiconductor wafer adhesively mounted on a wafer handling tape by means of an adhesive material, the wafer having circuit elements formed on an exposed surface thereof, the circuit elements being separated from each and formed into circuit chips by sawing or scribing while the wafer is mounted on the tape, a method of removing the individual circuit chips from the tape, comprising:

subjecting portions of the surface of the tape opposite that surface bearing the circuit chips to a vacuum, thereby to pull said portions of the tape away from the circuit chips;

heating the tape to reduce adhesion between the circuit chips and the adhesive material; and, removing the circuit chips from the tape and the adhesive material adhering to the tape.

2. In the method of claim 1 wherein the tape is placed on a grid of intersecting grooves formed in a planar surface to form pin-like elements defining said grooves, vacuum being pulled within the grooves to apply vacuum forces to the portions of the tape surmounting the grooves, thereby to pull said tape portions at least partially into the grooves and to release said tape portions from adhering contact with the chips.

3. In the method of claim 1 wherein the tape is heated to a temperature between approximately 50° C. and 65° C.

4. In the method of claim 1 wherein the chips are removed from the tape with a vacuum pencil.

5. In the method of claim 1 wherein the heating step is simultaneous with the subjection of the tape to the vacuum.

6. In the method of claim 1 wherein the vacuum is discontinued prior to the heating step.

7. The method of claim 1 wherein the adhesive material carried by the tape and acting to hold the chips on the tape comprises an acrylic adhesive material.

8. A method for removing semiconductor circuit chips from a handling tape to which the chips are adhered to one surface thereof by means of an adhesive material, comprising the steps of:

placing the surface of the tape opposite that surface bearing the circuit chips on a pattern of grooves formed in a rigid planar surface, the tape lying in contact with portions of the planar surface adjacent the grooves;

producing a vacuum within the grooves to apply vacuum forces to the portions of the tape surmounting the grooves to pull said tape portions at least partially into the grooves and to release said tape portions from adhering contact with the circuit chips, thereby to at least partially release the circuit chips from the tape;

heating the tape to further release the circuit chips from the tape and from the adhesive material on the tape; and, removing the circuit chips from the tape, the adhesive material separating from the circuit chips and remaining on the tape.

9. The method of claim 8 wherein the tape is heated to a temperature between approximately 50° C. and 65° C.

10. The method of claim 8 wherein the chips are removed from the tape with a vacuum pencil.

11. The method of claim 8 wherein the heating step is simultaneous with the subjection of the tape to the vacuum.

12. The method of claim 8 wherein the vacuum is discontinued prior to the heating step.

13. Apparatus for facilitating the removal of a chip bearing circuit elements formed on at least one face thereof from a tape to which a surface of the chip opposite the circuit elements is carried by means of an adhesive material, comprising:

a rigid body element having a planar surface portion with a pattern of grooves being formed in said planar surface portion, the tape being disposable over the planar surface portion with first portions of the tape contacting portions of the planar surface portions adjacent the grooves and second portions of the tape surmounting the grooves;

means for producing a vacuum within the grooves, the vacuum acting to pull the second portions of the tape into the grooves and thereby release at least the second portions of the tape from adhering contact with the chips; and, means associated with the body element for heating the tape, thereby further releasing the tape and the adhesive material carried by the tape from the chips and facilitating removal of the chips from the tape.

14. The apparatus of claim 13 wherein the grooves are acruate in section.

15. The apparatus of claim 13 wherein the grooves have arcuate lower portions and straight-sided upper portions.

16. The method of claim 8 wherein the adhesive material carried by the tape and acting to hold the chips on the tape comprises an acrylic adhesive material.

* * * * *